United States Patent
Son et al.

(10) Patent No.: US 10,636,971 B2
(45) Date of Patent: Apr. 28, 2020

(54) ORGANIC LIGHT EMITTING DIODE DISPLAY

(71) Applicant: Samsung Display Co., Ltd., Yongin, Gyeonggi-Do (KR)

(72) Inventors: Jung-Hyun Son, Yongin (KR); Hoon Kim, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/721,506

(22) Filed: Sep. 29, 2017

(65) Prior Publication Data
US 2018/0026191 A1    Jan. 25, 2018

Related U.S. Application Data

(62) Division of application No. 14/297,479, filed on Jun. 5, 2014, now Pat. No. 9,806,261, which is a division
(Continued)

(30) Foreign Application Priority Data

Jun. 10, 2011    (KR) .................. 10-2011-0056284

(51) Int. Cl.
*H01L 51/52* (2006.01)
*H01L 51/00* (2006.01)
(Continued)

(52) U.S. Cl.
CPC .......... *H01L 51/0024* (2013.01); *B32B 37/12* (2013.01); *C09J 11/04* (2013.01);
(Continued)

(58) Field of Classification Search
CPC ......... H01L 2251/5369; H01L 51/0024; H01L 51/5259; H01L 51/56
See application file for complete search history.

(56) References Cited

U.S. PATENT DOCUMENTS 3,706,618 A    12/1972    Persson
6,624,568 B2    9/2003    Silvernail
(Continued)

FOREIGN PATENT DOCUMENTS

EP    2 289 972 B1    4/2017
JP    2002-260847    9/2002
(Continued)

OTHER PUBLICATIONS

Notice of Allowance dated Oct. 1, 2015, issued in related U.S. Appl. No. 14/546,840.
(Continued)

*Primary Examiner* — Georgia Y Epps
*Assistant Examiner* — Jacob R Stern
(74) *Attorney, Agent, or Firm* — Lewis Roca Rothgerber Christie LLP

(57) ABSTRACT

Disclosed is an organic light emitting diode (OLED) display comprising a substrate; an organic light emitting element disposed on the substrate; an encapsulation substrate disposed on the organic light emitting element; and an adhesive layer formed on the substrate, covering the organic light emitting element, and bonding the substrate on which the organic light emitting element is formed with the encapsulation substrate.

11 Claims, 3 Drawing Sheets

Related U.S. Application Data of application No. 13/333,873, filed on Dec. 21, 2011, now Pat. No. 8,786,186.

(51) Int. Cl.
  *B32B 37/12* (2006.01)
  *C09J 11/04* (2006.01)
  *H01L 51/56* (2006.01)

(52) U.S. Cl.
  CPC ...... *H01L 51/5246* (2013.01); *H01L 51/5253* (2013.01); *H01L 51/5259* (2013.01); *H01L 51/56* (2013.01); *B32B 2457/206* (2013.01); *H01L 2251/5369* (2013.01); *Y10T 156/10* (2015.01)

(56) References Cited

U.S. PATENT DOCUMENTS

| | | | |
|---|---|---|---|
| 6,803,127 | B2 | 10/2004 | Su et al. |
| 6,936,131 | B2 | 8/2005 | McCormick et al. |
| 7,462,651 | B2 | 12/2008 | Cao et al. |
| 7,625,638 | B2 | 12/2009 | Uchibori et al. |
| 8,993,706 | B2 | 3/2015 | Schubert et al. |
| 2001/0046579 | A1 | 11/2001 | Ishii et al. |
| 2002/0135854 | A1 | 9/2002 | Takeuchi et al. |
| 2002/0180371 | A1 | 12/2002 | Yamazaki et al. |
| 2003/0147018 | A1* | 8/2003 | Sano ............... G02F 1/13454 349/42 |
| 2004/0229051 | A1 | 11/2004 | Schaepkens et al. |
| 2005/0241483 | A1* | 11/2005 | Okada ............... B01D 53/02 96/134 |
| 2006/0138928 | A1 | 6/2006 | Kim et al. |
| 2006/0220549 | A1 | 10/2006 | Kim et al. |
| 2007/0200496 | A1 | 8/2007 | Cok et al. |
| 2007/0248808 | A1 | 10/2007 | Lee et al. |
| 2007/0286821 | A1 | 12/2007 | Phillips |
| 2008/0309226 | A1 | 12/2008 | Kim et al. |
| 2009/0179550 | A1 | 7/2009 | Koo et al. |
| 2010/0079051 | A1 | 4/2010 | Kim et al. |
| 2010/0127615 | A1* | 5/2010 | Kim ............... H01L 27/3251 313/504 |
| 2010/0148661 | A1 | 6/2010 | Farquhar et al. |
| 2010/0283384 | A1 | 11/2010 | Lifka et al. |
| 2011/0097536 | A1 | 4/2011 | Jokisch et al. |
| 2011/0105637 | A1 | 5/2011 | Fujita et al. |
| 2011/0257008 | A1 | 10/2011 | Bartholomew et al. |

FOREIGN PATENT DOCUMENTS

| | | |
|---|---|---|
| JP | 2005-255730 A | 9/2005 |
| JP | 2007-42612 A | 2/2007 |
| JP | 5193493 B2 | 2/2013 |
| KR | 10-2003-0082256 A | 10/2003 |
| KR | 10-2004-0081163 | 9/2004 |
| KR | 10-2006-0000760 A | 1/2006 |
| KR | 10-2006-0104377 A | 10/2006 |
| KR | 10-0873704 | 12/2008 |
| KR | 10-2010-0125134 A | 11/2010 |
| WO | WO 2011/051952 | 5/2011 |

OTHER PUBLICATIONS

U.S. Office Action dated Mar. 16, 2015, issued in related U.S. Appl. No. 14/546,840.

* cited by examiner

ORGANIC LIGHT EMITTING DIODE DISPLAY

CROSS-REFERENCE TO RELATED APPLICATIONS

This application is a divisional application which claims priority under 35 U.S.C. § 120 from U.S. patent application Ser. No. 14/297,479, filed on Jun. 5, 2014, which is a divisional application of U.S. patent application Ser. No. 13/333,873, filed Dec. 21, 2011, now U.S. Pat. No. 8,786,186, issued Jul. 22, 2014, which claims priority to and the benefit of Korean Patent Application No. 10-2011-0056284 filed in the Korean Intellectual Property Office on Jun. 10, 2011, the disclosure of each of which are incorporated herein by reference.

BACKGROUND

Field

An organic light emitting diode (OLED) display is provided.

Description of the Related Technology

Since an organic light emitting diode (OLED) display has light emitting characteristic and does not require a separate light source unlike a liquid crystal display (LCD), the thickness and the weight may be reduced. And, since an organic light emitting diode (OLED) display exhibits high definition characteristics such as low power consumption, high luminance and high reaction speed, and the like, it is spotlighted as the next generation display device for a portable electronic device.

An organic light emitting diode (OLED) display includes a plurality of organic light emitting elements having a hole injection electrode, an organic emission layer, and an electron implant electrode. In the organic emission layer, light emitting is achieved by energy generated when excitons produced by combination of electrons and holes drop from the exited state to the ground state, and the organic light emitting diode (OLED) display forms an image therewith.

However, since the organic emission layer is sensitive to the external environment such as moisture or oxygen, if the organic emission layer is exposed to moisture and oxygen, quality of the organic light emitting diode (OLED) display may be deteriorated. Therefore, to protect the organic light emitting element and prevent penetration of moisture or oxygen in the organic emission layer, an encapsulation substrate is bonded on the display substrate on which the organic light emitting element is formed by an additional sealing process, or a protection layer with a thin thickness is formed on the organic light emitting element.

However, if an encapsulation substrate is used or a protection layer is formed, to completely prevent penetration of moisture or oxygen in the organic emission layer, the manufacturing process of the organic light emitting diode (OLED) display may become complicated and simultaneously, it is difficult to form the organic light emitting diode (OLED) display with a thin thickness.

SUMMARY OF CERTAIN INVENTIVE ASPECTS

One embodiment provides an organic light emitting diode (OLED) display that may effectively suppress moisture or oxygen penetration, may be manufactured by a simple process, and has improved yield.

Another embodiment provides a method for manufacturing the organic light emitting diode (OLED) display.

According to one embodiment, an organic light emitting diode (OLED) display is provided that includes a substrate; an organic light emitting element disposed on the substrate; an encapsulation substrate disposed on the organic light emitting element; and an adhesive layer formed on the substrate, covering the organic light emitting element, and bonding the substrate on which the organic light emitting element is formed with the encapsulation substrate, The adhesive layer is formed by sequentially accumulating a first filling adhesive layer, a hygroscopic adhesive layer and a second filling adhesive layer.

The hygroscopic adhesive layer may include at least one hygroscopic material selected from the group consisting of a silica gel ($SiO_2.H_2O$), alumino-silicate beads, montmorillonite, molecular sieve of zeolite ($Na_{12}AlO_3SiO_2.12H_2O$), activated carbon, alkali metal oxide, alkaline earth metal oxide, metal sulfate, metal halide, and metal perchlorate.

The first filling adhesive layer and the second filling adhesive layer may independently include at least one filling material selected from the group consisting of talc, silica, magnesium oxide, mica, montmorillonite, alumina, graphite, beryllia (beryllium oxide), aluminum nitride, silicon carbide, mullite and silicon.

The hygroscopic material may have a particle diameter of about 10 nm to about 20 μm.

The filling material may have a particle diameter of about 10 nm to about 20 μm.

The hygroscopic material or the filling material may be mesoporous, plate-shaped, spherical, rod-shaped, fiber-shaped, or core-shell typed.

The adhesive layer may include thermally curable resin or photocurable resin.

The first filling adhesive layer, the hygroscopic adhesive layer and the second filling adhesive layer may include the same kind of thermally curable resin or photocurable resin so that the adhesive layer may be formed as one integrated sheet without forming an interface between the layers.

The first filling adhesive layer and the second filling adhesive layer may independently include about 100 parts by weight of thermally curable resin or photocurable resin; and about 5 to 50 parts by weight of filling material.

The hygroscopic adhesive layer may include about 100 parts by weight of thermally curable resin or photocurable resin; and about 5 to 50 parts by weight of hygroscopic material.

The adhesive layer may have a thickness of about 5 μm to about 30 μm.

In the adhesive layer, thickness ratio of the first filling adhesive layer, hygroscopic adhesive layer and the second filling adhesive layer may be about 0.1 to about 1.2:about 0.1 to about 1.2:about 0.1 to about 1.2.

According to another embodiment, a method for manufacturing an organic light emitting diode (OLED) display is provided that includes forming an organic light emitting element on a substrate; sequentially accumulating a first filling adhesive layer, a hygroscopic adhesive layer and a second filling adhesive layer so as to form an adhesive layer; and intervening an adhesive layer between the substrate on which the organic light emitting element is formed and an encapsulation substrate so as to bond them.

The manufacturing method of the organic light emitting diode (OLED) display may include forming an adhesive layer wherein the first filling adhesive layer, hygroscopic adhesive layer and the second filling adhesive layer are sequentially accumulated by a roll to roll process, a roll to glass process, a press process or a diaphragm process.

In the manufacturing method of the organic light emitting diode (OLED) display, after forming the adhesive layer on the encapsulation substrate, bonding with the substrate on which the organic light emitting element is formed may be carried out by a lamination process, a press process or a diaphragm process.

The organic light emitting diode (OLED) display has excellent life-span characteristic.

DETAILED DESCRIPTION OF CERTAIN INVENTIVE EMBODIMENTS

Figure 1:
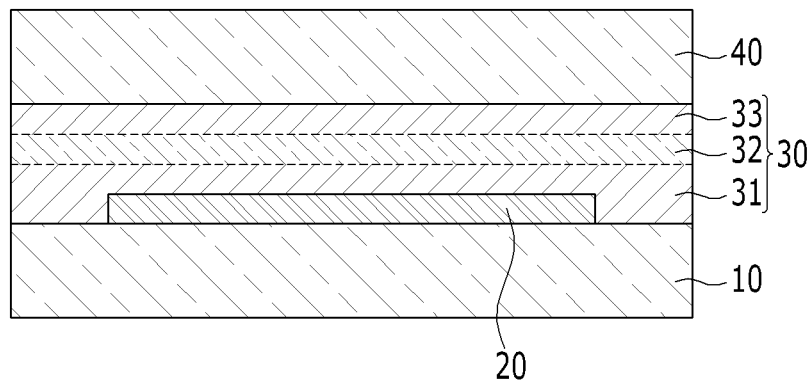
FIG. 1 schematically shows the cross-section of an organic light emitting diode (OLED) display according to one embodiment.

The present embodiments will be described more fully hereinafter with reference to the accompanying drawings, in which example embodiments are shown. As those skilled in the art would realize, the described embodiments may be modified in various different ways, all without departing from the spirit or scope of the present embodiments.

A part having no relationship with the description is omitted for clarity, and the same or similar constituent element is indicated by the same reference numeral throughout the specification.

The size and thickness of each constituent element as shown in the drawings are randomly indicated for better understanding and ease of description.

The size and thickness of each constituent element as shown in the drawings are exaggeratedly indicated for better understanding and ease of description.

In the drawings, the thickness of layers, films, panels, regions, etc., are exaggerated for clarity. In the drawings, the thicknesses of some layers and regions are exaggerated for better understanding and ease of description. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Hereinafter, an example embodiment is described referring to FIGS. 1 to 3.

FIG. 1 is a cross-sectional view of an organic light emitting diode (OLED) display 100 according to one embodiment.

Referring to FIG. 1, the organic light emitting diode (OLED) display 100 includes a substrate 10, an organic light emitting element 20 disposed on the substrate 10, an encapsulation substrate 40 disposed on the organic light emitting element 20, and an adhesive layer 30 intervening between the substrate 10 and the encapsulation substrate 40.

Figure 3:
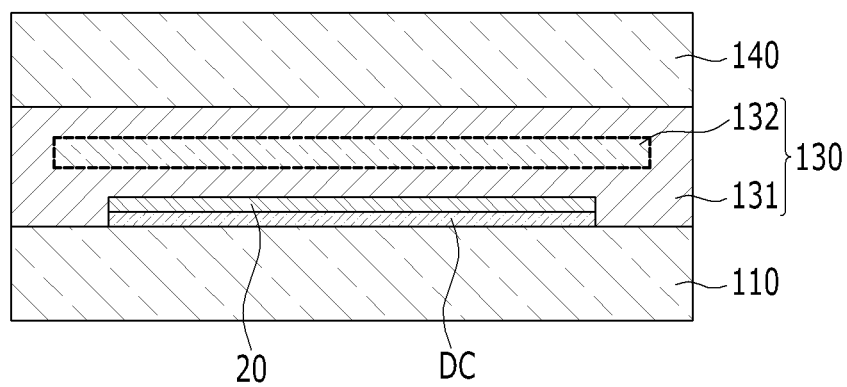
FIG. 3 schematically shows a cross-section of an organic light emitting diode (OLED) display according to yet another embodiment.

The organic light emitting element 20 has an organic emission layer (not shown) which emits light, displays an image, and is driven by a driving circuit part (DC) (shown in FIG. 3). The structures of the organic light emitting element 20 and the driving circuit part (DC) are not limited to the structures as shown in FIG. 3, and they may be formed in various structures within a range that may be easily modified by a person having ordinary knowledge in the art.

To suppress moisture or oxygen penetration in the organic emission layer, the upper part of the organic light emitting element 20 is sealed with an encapsulation substrate 40 with an intervening adhesive layer 30

Specifically, on the substrate 10 on which the organic light emitting element 20 is formed, an adhesive layer 30 is formed so as to cover the organic light emitting element 20, and an encapsulation substrate 40 is formed thereon.

The encapsulation substrate 40 may include an insulator of a glass substrate or a plastic substrate, and the like, and if the encapsulation substrate comprises transparent material, the display may be used for top emission.

The adhesive layer 30 is formed by sequentially accumulating a first filling adhesive layer 31, a hygroscopic adhesive layer 32 and a second filling adhesive layer 33. The first filling adhesive layer 31 and the second filling adhesive layer 33 include filling material, and the hygroscopic adhesive layer 32 includes hygroscopic material.

Since the adhesive layer 30 bonds the substrate 10 on which the organic light emitting element 20 is formed with the encapsulation substrate 40 and simultaneously includes hygroscopic material having hygroscopic/adsorption characteristic and filling material that may block moisture incorporated from outside due to barrier characteristic to external moisture, it may protect the organic light emitting element 20 from moisture to improve life-span.

The first filling adhesive layer 31, hygroscopic adhesive layer 32 or the second filling adhesive layer 33 may be manufactured from a composition mixing filling material or hygroscopic material with thermally curable resin or photocurable resin. The composition is described later.

If the first filling adhesive layer 31, hygroscopic adhesive layer 32 and the second filling adhesive layer 33 are all manufactured from a composition including the same kind of thermally curable resin or photocurable resin, the adhesive layer 30 may be formed as one integrated sheet without forming an interface of the first filling adhesive layer 31, hygroscopic adhesive layer 32 and the second filling adhesive layer 33.

The hygroscopic material that may be included in the hygroscopic adhesive layer 32 may include any getter material that may easily react with moisture and active gas such as oxygen so that the active gas may not damage the organic light emitting element 20. For example, a kind of water-removing getter material, a drying agent may be used. The hygroscopic material may be a particle or a medium that may absorb and adsorb moisture and oxygen, and it may include any material capable of absorbing and adsorbing moisture and oxygen without limitations.

The hygroscopic material may include, for example, a clay such as silica gel ($SiO_2 \cdot H_2O$), alumino-silicate beads, montmorillonite, and the like, a molecular sieve of zeolite ($Na_{12}AlO_3SiO_2 \cdot 12H_2O$), activated carbon, alkali metal oxide, alkaline earth metal oxide, metal sulfate, metal halide, and metal perchlorate, and a combination thereof.

The alkali metal oxide may include lithium oxide ($Li_2O$), sodium oxide ($Na_2O$) or potassium oxide ($K_2O$); the alkaline earth metal oxide may include barium oxide (BaO), calcium oxide (CaO), magnesium oxide (MgO), and the like, the metal sulfate may include lithium sulfate ($Li_2SO_4$), sodium sulfate ($Na_2SO_4$), calcium sulfate ($CaSO_4$), magnesium sulfate (MgSO$_4$), cobalt sulfate (CoSO$_4$), gallium sulfate (Ga$_2$(SO$_4$)$_3$), titanium sulfate (Ti(SO$_4$)$_2$), nickel sulfate (NiSO$_4$), and the like; the metal halide may include calcium chloride (CaCl$_2$), magnesium chloride (MgCl$_2$), strontium chloride (SrCl$_2$), yttrium chloride (YCl$_3$), copper chloride (CuCl$_2$), cesium fluoride (CsF), tantalum fluoride (TaF$_5$), niobium fluoride (NbF$_5$), lithium bromide (LiBr), calcium bromide (CaBr$_2$), cerium bromide (CeBr$_3$), selenium bromide (SeBr$_4$), vanadium bromide (VBr$_3$), magnesium bromide (MgBr$_2$), barium iodide (BaI$_2$), magnesium iodide (MgI$_2$), and the like, the metal perchlorate may include barium perchlorate (Ba(ClO$_4$)$_2$), magnesium perchlorate (Mg(ClO$_4$)$_2$), and the like, but are not limited thereto.

The silica gel is amorphous silica prepared from sodium silicate and sulfuric acid, which exhibits excellent adsorption amount of about 40 wt % based on the weight of water, has large adsorption capacity at about 25° C. or less and decreased adsorption capacity similar to clay as temperature increases, is non-toxic, noncorrosive, non-deliquescent, and water-insoluble, may be easily handled, is inexpensive, and does not cause pollution problem, and thus is most widely used.

The montmorillonite is an adsorbent commonly in the form of beads prepared by drying natural product of magnesium aluminum silicate in the form of subbentonite, which is most inexpensive although it is easily powderized and thus may cause pollution, and has inferior adsorption capacity compared to silica gel.

Since the zeolite has a micro-sphere structure of a net crystal structure and has very large specific surface area of about 700 to about 800 m$^2$ per gram, it does not release moisture in the product in the packaging as temperature rises like silica gel or clay, but it is relatively expensive.

The activated carbon has very large specific surface area of about 200 to about 1200 m$^2$ per gram and thus has excellent adsorption capacity, but it may cause pollution and thus is scarcely used as a desiccant for a common use.

Among the alkaline earth metal oxide, calcium oxide is a lime of a calcinated or recalcinated type having moisture adsorption capacity of about 28.5 wt % or less, and it is mainly used for dehumidifying food packaging of chilled or frozen foods because it has moisture adsorption capacity even at very low relative humidity Among the metal sulfate, calcium sulfate is commercially known as Drierite, is prepared by dehydrating plaster, is chemically stable, is non-disintegrable, non-toxic and non-corrosive, and does not release adsorbed moisture even if temperature rises, but it has low moisture adsorption capacity of about 10 wt % and thus is used within a limited range.

The filling material that may be used in the first filling adhesive layer 31 and the second filling adhesive layer 33 realizes barrier characteristic to moisture. It is not specifically limited as long as it may act as a filler having barrier characteristic in the adhesive layer 30 of filling material, and specific examples thereof may include talc, silica, magnesium oxide, mica, montmorillonite, alumina, graphite, beryllia (beryllium oxide), aluminum nitride, silicon carbide, mullite, silicon, and a combination thereof, but are not limited thereto. The filling material may be a particle prepared by synthesis or it may be a particle prepared by processing gemstone.

The filling material included in a resin composition for the filling adhesive layer of the first filling adhesive layer 31 and the second filling adhesive layer 33 is uniformly dispersed in the composition after curing, and thus, it may distribute stress acting on the composition to reinforce adhesion, and may effectively block moisture penetrated and diffused in the composition so that the moisture may not pass the first filling adhesive layer 31 or the second filling adhesive layer 33 and be diffused to the organic light emitting element 20.

The hygroscopic material may have a particle diameter of about 10 nm to about 20 μm. For example, the hygroscopic material may have an average particle diameter of about 10 nm to about 100 nm.

The filling material may have a particle diameter of about 10 nm to about 20 μm. For example, the filling material may have an average particle diameter of about 10 nm to about 100 nm. For another example, the filling material may have an average particle diameter of about 2 μm to about 5 μm.

The hygroscopic material or the filling material may be mesoporous, plate-shaped, spherical, rod-shaped, fiber-shaped, core-shell typed, and the like, but is not limited thereto.

The first filling adhesive layer 31 or the second filling adhesive layer 33 may include 5 to 50 parts by weight of the filling material, based on 100 parts by weight of the thermosetting resin or photocurable resin. When the filling material is included in the content of about 5 to about 50 parts by weight based on 100 parts by weight of the thermosetting resin or photocurable resin, barrier characteristic to moisture penetration may be improved.

The hygroscopic adhesive layer 32 may include about 5 to about 50 parts by weight of the hygroscopic material based on 100 parts by weight of the thermosetting resin or photocurable resin.

The adhesive layer 30 may have a thickness of about 5 μm to about 50 μm. For example, the adhesive layer 30 may have a thickness of about 10 μm, about 20 μm or about 30 μm. When the thickness of the adhesive layer 30 is within the above range, it may not be influenced by surface level difference and adhesion property may be secured.

The thickness ratio of the first filling adhesive layer 31, the hygroscopic adhesive layer 32 and the second filling adhesive layer 33 may be about 0.1 to about 1.2:about 0.1 to about 1.2:about 0.1 to about 1.2. For example, each layer may be manufactured in the ratio of about 1:1:1. When the thickness ratio is within the above range, adhesion characteristic may be secured without being influenced by surface level difference.

The organic light emitting diode (OLED) display 100 may improve reliability of the organic light emitting element 20 by including the adhesive layer 30. If the material of the encapsulation substrate is not glass, moisture and the like may be incorporated through a defect part of pin-holes and pores formed by particles, but the hygroscopic adhesive layer in the adhesive layer 30 may absorb or adsorb the moisture, or the filling adhesive layer may block the moisture to protect the organic light emitting element 20.

In general, to protect the organic light emitting element 20 from moisture incorporated from outside, a getter may be coated on the outer part, but the organic light emitting diode (OLED) display 100 may be dispensed with it to shorten the process. If a getter forming process is skipped, a getter line may not be formed on the outer part and thus margin may be secured to reduce bezel.

If the adhesive layer 30 is formed in a sandwich structure of the first filling adhesive layer 31, the hygroscopic adhesive layer 32 and the second filling adhesive layer 33, the hygroscopic adhesive layer 32 may effectively block moisture incorporated from the encapsulation substrate 40 to the organic light emitting element 20, and the filling adhesive layers 31 and 33 may bond to the substrate 10, the organic light emitting element 20, and the encapsulation substrate 40, and the like while maintaining adhesion strength.

Namely, the adhesive layer 30 may effectively block moisture incorporated to the organic light emitting element 20 without decreasing adhesion characteristic, to increase reliability of the organic light emitting element 20 and improve life-span.

The first filling adhesive layer 31, hygroscopic adhesive layer 32 or the second filling adhesive layer 33 may be manufactured from a composition including filling material or a composition including hygroscopic material as explained above, wherein the composition for manufacturing the first filling adhesive layer 31, the hygroscopic adhesive layer 32 and the second filling adhesive layer 33 may include thermally curable resin or photocurable resin. The composition, if necessary, may further include additives such as a thermally curing agent, a cure accelerating agent, a coupling agent, a spacer, a photoacid generator, a radical initiator, or a combination thereof.

If the composition for manufacturing the first filling adhesive layer 31, the hygroscopic adhesive layer 32 or the second filling adhesive layer 33 is prepared as a thermally curable resin composition, it may include hygroscopic material or filling material in addition to a thermally curable resin, a thermally curing agent, a cure accelerating agent, a coupling agent, an antioxidant and solvent.

The thermally curable resin may include epoxy resin. The epoxy resin may include bisphenol-based epoxy, ortho-cresol novolac, multi-functional epoxy, amine-based epoxy, heterocyclic epoxy, substituted epoxy, and naphthol-based epoxy, specifically, bisphenol A epoxy resin, bisphenol F epoxy resin, hydrogenated bisphenol type epoxy resin, alicyclic epoxy resin, aromatic epoxy resin, novolac, dicyclopentadiene type epoxy resin, and a combination thereof. Currently available epoxy resin includes a bisphenol-based epoxy resin such as EPICLON 830-S, EPICLON EXA-830CRP, EPICLON EXA 850-S, EPICLON EXA-850CRP, and EPICLON EXA-835LV (Dainippon Ink & Chemicals Inc.); EPIKOTE 807, EPIKOTE 815, EPIKOTE 825, EPIKOTE827 EPIKOTE 828, EPIKOTE 834, EPIKOTE 1001, EPIKOTE 1004, EPIKOTE 1007, and EPIKOTE 1009 (Yuka Shell Epoxy Co.) DER-330, DER-301, DER-361 (DOW Chemical Company), YD-128, YDF-170, and the like (KUKDO CHEMICAL CO. LTD.); an ortho-cresol novolac-based epoxy resin such as YDCN-500-1P, YDCN-500-4P, YDCN-500-5P, YDCN-500-7P, YDCN-500-80P, YDCN-500-90P (KUKDO CHEMICAL CO. LTD.), EOCN-102S, EOCN-103S, EOCN-104S, EOCN-1012, EOCN-102S, EOCN-1027, and the like (Nippon Kayaku Co. Ltd.); a multi-functional epoxy resin such as Epon 1031S (Yuka Shell Epoxy Co.), ALALDITE 0163 (Ciba Specialty Chemicals Corp.), DENACOL EX-611, DENACOL EX-614, DENACOL EX-614B, DENACOL EX-622, DENACOL EX-512, DENACOL EX-521, DENACOL EX-421, DENACOL EX-411, DENACOL EX-321, and the like (Nagase ChemteX Corporation); an amine-based epoxy resin such as EPIKOTE 604 (Yuka Shell Epoxy Co.), YH-434 (KUKDO CHEMICAL CO. LTD.), TETRAD-X, TETRAD-C(Mitsubishi Gas Chemical Company, Inc.), ELM-120 (Sumitomo Chemical Co., Ltd.), and the like, a heterocyclic epoxy resin such as PT-810 (Ciba Specialty Chemicals Corp.); a substituted epoxy resin such as ERL-4234, ERL-4299, ERL-4221, ERL-4206 (Union Carbide Corp.) and a naphthol-based epoxy resin such as EPICLON HP-4032, EPICLON HP-4032D, EPICLON HP-4700, EPICLON 4701 (Dainippon Ink & Chemicals Inc.). These may be used singularly or as a mixture of two or more. To obtain excellent film coating characteristic, a phenoxy resin may be applied, and a high molecular weight resin such as EPIKOTE 1256 (Japan Epoxy Resins Co., Ltd.) and PKHH (InChem Co.), YP-70 (KUKDO CHEMICAL CO. LTD.), and the like may be applied.

As the thermally curing agent, commonly used one for thermally curing epoxy resin may be used without specific limitation. Specific examples of the thermally curing agent include a polyamine-based curing agent such as diethylenetriamine, triethylenetetramine, N-aminoethylpiperazine, diamino diphenylmethane, sebacic acid dihydrazide, and the like; an acid anhydride curing agent such as phthalic anhydride, phthalic tetrahydroanhydride, phthalic hexahydroanhydride, phthalic methyltetrahydroanhydride, phthalic methylhexahydroanhydride, methyl nadic anhydride, and the like; a phenolnovolac curing agent; a polymercaptan curing agent such as trioxanetrimethylenemercaptan, and the like; a tertiary third amine compound such as benzyldimethylamine, 2,4,6-tris(dimethylaminomethyl)phenol, and the like; an imidazole compound such as 2-methylimidazole, 2-ethyl-4-methylimidazole, 1-benzyl-2-methylimidazole, and the like. A solid dispersion type potential curing agent or a potential curing agent encapsulated in a microcapsule, and the like may be used.

If an amine-based curing agent is used, aliphatic amine, modified aliphatic amine, aromaticamine, secondary amine or tertiary amine, and the like may be used, and for example, benzyldimethylamine, triethanolamine, triethylene tetramine, diethylenetriamine, triethyleneamine, dimethylaminoethanol, tri(dimethylaminomethyl)phenol, and the like may be used, or a curing agent having —OH, —COOH, —SO$_3$H, —CONH$_2$, —CONHR (R represents an alkyl group), —CN(CN)NH$_2$, —SO$_3$NH$_2$, —SO$_3$NHR (R represents an alkyl group) or —SH at the end group may be used. The R may be a C1-C10 alkyl group, for example, a C1-C10 linear or branch saturated hydrocarbon group, particularly a C1-C4 linear or branched alkyl group, and in some embodiments, methyl, ethyl, n-propyl, isopropyl, isobutyl, n-butyl, and t-butyl.

The imidazole-based curing agent may include imidazole, isoimidazole, 2-methyl imidazole, 2-ethyl-4-methylimidazole, 2,4-dimethylimidazole, butylimidazole, 2-heptadecenyl-4-methylimidazole, 2-methylimidazole, 2-undecenylimidazole, 1-vinyl-2-methylimidazole, 2-n-heptadecylimidazole, 2-undecylimidazole, 2-heptadecylimidazole, 2-phenylimidazole, 1-benzyl-2-methylimidazole, 1-propyl-2-methylimidazole, 1-cyanoethyl-2-methylimidazole, 1-cyanoethyl-2-ethyl-4-methylimidazole, 1-cyanoethyl-2-undecylimidazole, 1-cyanoethyl-2-phenylimidazole, 1-guanaminoethyl-2-methylimidazole, an addition product of imidazole and methylimidazole, an addition product of imidazole and trimellitic acid, 2-n-heptadecyl-4-methylimidazole, phenylimidazole, benzylimidazole, 2-methyl-4,5-diphenylimidazole, 2,3,5-triphenylimidazole, 2-styrylimidazole, 1-(dodecyl benzyl)-2-methylimidazole, 2-(2-hydroxyl-4-t-butylphenyl)-4,5-diphenylimidazole, 2-(2-methoxyphenyl)-4,5-diphenylimidazole, 2-(3-hydroxyphenyl)-4,5-diphenylimidazole, 2-(p-dimethyl-aminophenyl)-4,5-diphenylimidazole, 2-(2-hydroxyphenyl)-4,5-diphenylimidazole, di(4,5-diphenyl-2-imidazole)-benzene-1,4, 2-naphthyl-4,5-diphenylimidazole, 1-benzyl-2-methylimidazole, 2-p-methoxystyrylimidazole, and the like.

The acid anhydride curing agent is an epoxy resin, specifically a hybrid epoxy resin including siloxane.

The acid anhydride curing agent may include phthalic anhydride, maleic anhydride, trimellitic anhydride, pyromellitic anhydride, hexahydrophthalic anhydride, tetrahydrophthalic anhydride, methylnadic anhydride, nadic anhydride, glutaric anhydride, methylhexahydrophthalic anhydride, methyltetrahydrophthalic anhydride or 5-(2,5-dioxotetrahydrol)-3-methyl-3-cyclohexene-1,2-dicarboxylic acidanhydride.

The cure accelerating agent may include a quaternary ammonium salt, a quaternary sulfonium salt, various metal salts, imidazole, tertiary amine, and the like. Examples of the quaternary ammonium salt include tetra methyl ammonium bromide, tetrabutylammoniumbromide, and the like, examples of the quaternary sulfonium salt include tetra phenyl phosphonium bromide, tetrabutylphosphoniumbromide, examples of the metal salt may include zinc octylate, tin octylate, and the like, examples of the imidazole may include 1-benzyl-2-methyl imidazole, 1-benzyl-2-phenyl imidazole, 2-ethyl-4-methyl imidazole, and the like, and examples of the tertiary amine may include benzyl dimethyl amine, and the like.

The boron-based cure accelerating agent may include phenylboronic acid, 4-methylphenylboronic acid, 4-methoxyphenyl boronic acid, 4-trifluoromethoxyphenyl boronic acid, 4-tert-butoxyphenyl boronic acid, 3-fluoro-4-methoxyphenyl boronic acid, pyridine-triphenylborane, 2-ethyl-4-methyl imidazolium tetraphenylborate, 1,8-diazabicyclo[5.4.0]undecene-7-tetraphenylborate, 1,5-diazabicyclo[4.3.0]nonene-5-tetraphenylborate, lithium triphenyl (n-butyl)borate), and the like, the imidazole-based cure accelerating agent may include 2-methylimidazole, 2-undecylimidazole, 2-heptadecylimidazole, 2-ethyl-4-methylimidazole, 2-phenylimidazole, 2-phenyl-4-methylimidazole, 1-benzyl-2-phenylimidazole, 1,2-dimethylimidazole, 1-cyanoethyl-2-methylimidazole, 1-cyanoethyl-2-ethyl-4-methylimidazole, 1-cyanoethyl-2-undecylimidazole, 1-cyanoethyl-2-phenylimidazole, 1-cyanoethyl-2-undecylimidazolium-trimellitate, 1-cyanoethyl-2-phenylimidazolium-trimellitate, 2,4-diamino-6-[2'-methylimidazoly-1']-ethyl-s-triazine, 2,4-diamino-6-[2'-undecylimidazoly-1']-ethyl-s-triazine, 2,4-diamino-6-[2'-ethyl-4'-methylimidazoly-1']-ethyl-s-triazine, 2,4-diamino-6-[2'-methylimidazoly-1']-ethyl-s-triazine isocyanuric acid adduct dihydrate, a 2-phenylimidazole isocyanuric acid adduct, 2-methylimidazole isocyanuric acid adduct dihydrate, 2-phenyl-4,5-dihydroxymethylimidazole, 2-phenyl-4-methyl-5-hydroxymethylimidazole, 2,3-dihyro-1H-pyrrolo[1,2-a]benzimidazole, 4,4'-methylene bis (2-ethyl-5-methylimidazole), 2-methylimidazoline, 2-phenylimidazoline, 2,4-diamino-6-vinyl-1,3,5-triazine, a 2,4-diamino-6-vinyl-1,3,5-triazine isocyanuric acid adduct, a 2,4-diamino-6-methacryloyloxylethyl-1,3,5-triazineisocyanuric acid adduct, 1-(2-cyanoethyl)-2-ethyl-4-methylimidazole, 1-cyanoethyl-2-methylimidazole, 1-(2-cyanoethyl)2-phenyl-4,5-di-(cyanoethoxymethyl)imidazole, 1-acetyl-2-phenylhydrazine, 2-ethyl-4-methylimidazoline, 2-benzyl-4-methyl dimidazoline, 2-ethyl imidazoline, 2-phenyl imidazole, 2-phenyl-4,5-dihydroxymethylimidazole, melamine, dicyandiamide, and the like, and this boron-based cure accelerating agent may be used singularly or as a mixture of two or more.

The coupling agent may include a silane coupling agent, a titanate-based coupling agent, an aluminate-based coupling agent, a silicon compound, and the like, and the coupling agent may be used singularly or as a mixture thereof. The coupling agent may improve adhesion of a resin composition and decrease viscosity, and it may be included in an amount of about 0.001 to about 5 parts by weight, for example, about 0.01 to about 3 parts by weight, based on 100 parts by weight of the thermosetting resin in the thermosetting resin composition.

The silane coupling agent functions as an adhesion improving agent for improving adhesion between the surface of inorganic material such as silica and a resin in the composition. The silane coupling agent may include epoxy containing silane or mercapto containing silane, and the like, wherein the epoxy containing silane may include 2-(3,4 epoxy cyclo hexyl)-ethyltrimethoxysilane, 3-glycidoxytrimethoxysilane, 3-glycidoxypropyltriethoxysilane, 3-glycidoxypropyltriethoxysilane, an amine group containing silane may include N-2(aminoethyl)3-aminopropylmethyldimethoxysilane, N-2(aminoethyl)3-aminopropyltrimethoxysilane, N-2(aminoethyl)3-aminopropyltriethoxysilane, 3-aminopropyltrimethoxysilane, 3-aminopropyltriethoxysilane, 3-triethoxysily-N-(1,3-dimethylbutylidene)propylamine, N-phenyl-3-aminopropyltrimethoxysilane, the mercapto containing silane may include 3-mercaptopropylmethyldimethoxysilane, 3-mercaptopropyltriethoxysilane, and an isocyanate containing silane may include 3-isocyanatepropyltriethoxysilane, and the silane coupling agent may be used singularly or as a mixture thereof.

The antioxidant may prevent oxidation degradation during thermal curing of the thermosetting resin composition, thereby further improving thermal stability of the cured product. The antioxidant may include a phenol based antioxidant, a sulfur based antioxidant, a phosphorous based antioxidant, and the like. The phenol based antioxidant may include dibutyl hydroxy toluene, 2,6-di-tetra-butyl-p-cresol (hereinafter, referred to as BHT), and the like, the sulfur based antioxidant may include mercapto propionic acid derivative, and the like, the phosphorous based antioxidant may include triphenylphosphite, 9,10-dihydro-9-oxa-10-phosphaphenanthrene-10-oxide (hereinafter, HCA), and the like, and the antioxidant may be used singularly or as a mixture thereof. And, it may be included in an amount of about 0.001 to about 5 parts by weight, for example about 0.01 to about 0.5 parts by weight, based on 100 parts by weight of the thermosetting resin in the thermosetting resin composition.

If the composition for manufacturing the first filling adhesive layer 31, the hygroscopic adhesive layer 32, or the second filling adhesive layer 33 is prepared as a photocuarble resin composition, it may include a filling material or a hygroscopic material in addition to a photocurable epoxy resin, a photoinitiator, a coupling agent, a spacer, a photoacid generator, a radical generator and a solvent.

The photocurable epoxy resin that may be applied for the photocurable resin composition may include a commonly used aromatic epoxy resin, an alicyclic epoxy resin, and a mixture thereof. The aromatic epoxy resin may include a biphenyl type, bisphenol A type, bisphenol F type, phenol novolac, dicyclopentadiene epoxy resin, and the like, and a mixture thereof.

The photoinitiator is not specifically limited as long as it may photocure the epoxy resin. The photoinitiator may include an aromatic diazonium salt, an aromatic sulfonium salt, an aromatic iodine aluminum salt, an aromatic sulfonium aluminum salt, a metallocene compound and an iron complex salt. For example, an aromatic sulfonium salt may be used, and specific examples thereof may include an aromatic sulfonium hexafluoro phosphate compound, an aromatic sulfonium hexafluoro antimonate compound, and the like.

As the coupling agent, a silane-based or a titan-based coupling agent, and a silicon compound may be used alone or in combination. For example, a silane coupling agent containing alkoxysilane and diglycidylether in one molecule may be used.

The spacer is not specifically limited as long as it may constantly maintain the thickness of a panel after curing, and particularly, a spacer capable of maintaining the thickness of a panel about 5 to about 50 µm, for example about 5 to about 25 µm may be used. The spacer may have a spherical shape, a log shape, and the like, and the shape of the spacer is not specifically limited as long as it may constantly maintain the thickness of a panel.

The photoacid generator is not specifically limited as long as it may produce Lewis acid or Bronsted acid by exposure, and a sulfide salt based compound such as organic sulfonic acid, and onium based compound such as onium salt may be used. More specific examples include phthimidotrifluoromethanesulfonate, dinitrobenzyltosylate, n-decyldisulfone, naphthylimidotrifluoromethanesulfonate, diphenyl iodide, hexafluorophosphate, diphenyl iodide, hexafluoroarsenate, diphenyl iodide, hexafluoroantimonate, diphenylparamethoxyphenylsulfonium triflate, diphenylparatoluenylsulfonium triflate, diphenylparaisobutylphenylsulfonium triflate, triphenylsulfonium hexafluoro arsenate, triphenylsulfonium hexafluoro antimonate, triphenylsulfonium triflate, dibutylnaphthylsulfonium triflate, and a mixture thereof.

The radical initiator may be used together with the photoacid generator, and it may include a radical photopolymerization initiator that is decomposed by electromagnetic energy ray such as UV ray thereby producing a radical, and a thermally degradable radical polymerization initiator that is decomposed by heat to produce a radical. The radical photopolymerization initiator may include a type I alpha cleavage initiator such as an acetophenone derivative such as 2-hydroxy-2-methylpropinophenone and 1-hydroxycyclohexyl phenyl ketone; an acylphosphine oxide derivative such as bis(2,4,6-trimethylbenzoyl)phenylphosphine oxide; a benzoin ether derivative such as benzoin methyl ether and benzoin ethyl ether, and the like. Representative examples of a commercially available radical photoinitiator may include IRGACURE 651, IRGACURE 184, IRGACURE 907, DAROCUR 1173 and IRGACURE 819 (Ciba Specialty Chemicals corp.)

A type II photoinitiator may be also used, and the examples may include a compound such as benzophenone, isopropylthioxanthone and anthraquinone. Variously substituted derivatives of the basic compounds may also be used. The thermally decomposable radical polymerization initiator may include peroxides such as 1,1,3,3-tetramethylbutylperoxy-2-ethyl-hexanoate, 1,1-bis(t-butylperoxy)cyclohexane, 1,1-bis(t-butylperoxy)cyclo-dodecane, di-t-butylperoxyisophthalate, t-butylperoxybenzoate, dicumylperoxide, t-butylcumylperoxide, 2,5-dimethyl-2,5-di(t-butylperoxy)hexane, 2,5-dimethyl-2,5-di(t-butylperoxy)-3-hexyne, and cumene hydroperoxide. The radical polymerization initiator may be included in an effective amount, for example, about 0.01 to about 5 parts by weight based on 100 parts by weight of the photocurable resin in the photocurable resin composition.

The solvent that may be used in the composition for manufacturing the first filling adhesive layer 31, hygroscopic adhesive layer 32 or the second filling adhesive layer 33 may include methylethylketone (MEK), tetrahydrofuran (THF), toluene, and the like, it is not specifically limited as long as it may form a solution for forming a film, and it may be used alone or in a mixture of two or more kinds to obtain excellent film characteristic.

The compositions for manufacturing the first filling adhesive layer 31, hygroscopic adhesive layer 32 and the second filling adhesive layer 33 are respectively coated on substrate films 111 and 112, dried and formed as a sheet, and then, stacked to manufacture an adhesive layer 30. The manufacturing method is not specifically limited and the adhesive layer may be variously manufactured. If characteristic may be embodied by forming a sheet, it may be manufactured as non-cured gel, or a solid-phase, or it may be manufactured as liquid and post-treated.

A method of stacking manufactured hygroscopic adhesive sheet and filling sheet to form an adhesive layer may be conducted according to a commonly known method without specific limitation. For example, a hygroscopic adhesive sheet, a filling adhesive sheet and a hygroscopic adhesive sheet may be sequentially accumulated by a roll to roll process, a roll to glass process, a press process, or a diaphragm process to manufacture an adhesive layer 30 so that each sheet may form a hygroscopic adhesive layer or a filling adhesive layer FIG. 2 is a schematic view showing a method of forming an adhesive layer 130 according to another embodiment. First, a composition for forming a hygroscopic adhesive layer that includes hygroscopic material is coated on a substrate film 111 to form a hygroscopic adhesive sheet. On the other hand, a composition for forming a filling adhesive layer that includes filling material is coated on another substrate film 112 to form a filling adhesive sheet. The prepared hygroscopic adhesive sheet and filling adhesive sheet are stacked. The stacked hygroscopic adhesive sheet and filling adhesive sheet are bonded by a roll to roll process, a roll to glass process, a press process, or a diaphragm process to manufacture an adhesive layer 130.

As such, process advantage and structural advantage may be obtained by using the adhesive layer 130 as one integral sheet.

Figure 2:
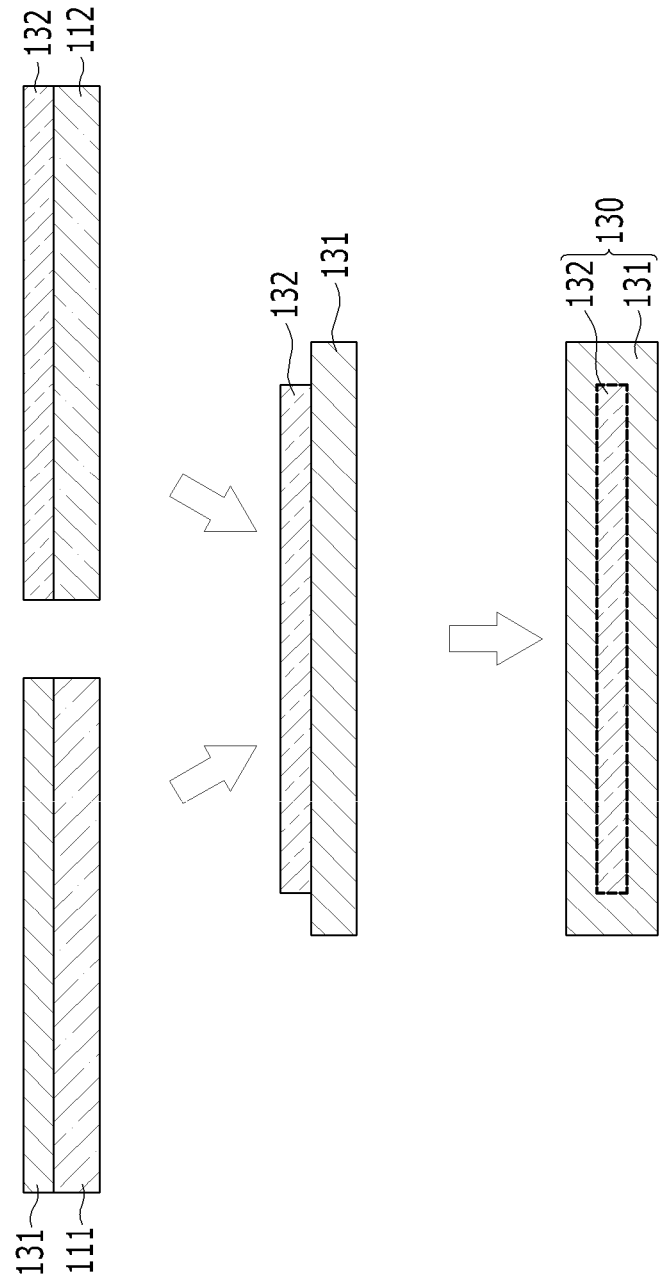
FIG. 2 schematically shows a manufacturing method of an adhesive layer that may be included in an organic light emitting diode (OLED) display according to another embodiment.

FIG. 3 is a cross-sectional view of an organic light emitting diode (OLED) display 200 manufactured using the adhesive layer 130 manufactured as shown in FIG. 2.

In the organic light emitting diode (OLED) display 200 of FIG. 3, a driving circuit part (DC) and an organic light emitting element 120 are formed on a substrate 110. The driving circuit part (DC) drives the organic light emitting element 120. The structures of the organic light emitting element 120 and the driving circuit part (DC) are not limited as shown in FIG. 3, and they may be formed in various structures within the range that may be modified by a person having ordinary knowledge in the art according to a direction where the organic light emitting element 120 emits light and displays an image. For example, the adhesive layer 130 may be manufactured by forming on a TFT substrate. The substrate 110 on which the organic light emitting element 120 is formed and the encapsulation substrate 140 are bonded using the adhesive layer 130 manufactured as shown in FIG. 2. The bonding may be conducted by commonly known methods without specific limitation, and for example, a lamination process, a press process or a diaphragm process, and the like may be used.

According to yet another embodiment, a method for manufacturing an organic light emitting diode (OLED) display is provided that includes forming an organic light emitting element on a substrate; sequentially accumulating a first filling adhesive layer, a hygroscopic adhesive layer and a second filling adhesive layer so as to form an adhesive layer; and, intervening an adhesive layer between the substrate on which the organic light emitting element is formed and an encapsulation substrate so as to bond them.

The following examples illustrate the present embodiments in more detail. These examples, however, are not in any sense to be interpreted as limiting the scope of the present embodiments.

EXAMPLE

Example 1

About 30 parts by weight of epoxy resin EXA-835LV (Dainippon Ink & Chemicals Inc.), about 45 parts by weight of a phenoxy resin EPIKOTE-1256 (Japan Epoxy Resins Co. Ltd.), about 5 parts by weight of a thermally curing agent C11Z-CNS (Shikoku Chemicals Corp.), about 20 parts by weight of CaO (UBE Industries, Ltd.) (particle diameter: about 1 to 2 μm), and about 100 parts by weight of an organic solvent MEK were mixed to prepare a composition for a hygroscopic adhesive layer, and then, the composition was coated on a PET substrate film to a thickness of about 20 μm to manufacture a hygroscopic adhesive sheet.

On the other hand, about 30 parts by weight of epoxy resin EXA-835LV (Dainippon Ink & Chemicals Inc.), about 45 parts by weight of a phenoxy resin EPIKOTE-1256 (Japan Epoxy Resins Co. Ltd.), about 5 parts by weight of a thermally curing agent C11Z-CNS (Shikoku Chemicals Corp.), about 15 parts by weight of Talc D-1000 (Nippon Talc Co., Ltd.) (particle diameter: about 1 to 2 μm), a silane coupling agent KBM-403 (Shinetsu), and about 100 parts by weight of an organic solvent MEK were mixed to prepare a composition for a filling adhesive layer, and then, the composition was coated on a PET substrate film to a thickness of about 20 μm to manufacture a filling adhesive sheet.

The hygroscopic adhesive sheet and filling adhesive sheet respectively formed on a PET substrate film were stacked and bonded by a lamination process, and then, the PET substrate film of the filling adhesive sheet were removed. On the filling adhesive sheet that is exposed by removing the PET substrate film, the hygroscopic adhesive sheet was stacked again and bonded by a lamination process to form an adhesive layer stacked in three layers of hygroscopic adhesive layer-filling adhesive layer-hygroscopic adhesive layer, and the PET substrate films were removed.

On the other hand, an organic light emitting element was formed on a glass substrate, the above manufactured adhesive layer was intervened between the substrate and a glass encapsulation substrate so as to cover the organic light emitting element, and they were bonded at a pressure of about 60 Kpa with a diaphragm to manufacture an organic light emitting diode (OLED) display.

Example 2

An organic light emitting diode (OLED) display was manufactured by the same method as Example 1, except that about 25 parts by weight of CaO and about 20 parts by weight of talc were used.

Example 3

An organic light emitting diode (OLED) display was manufactured by the same method as Example 1, except that about 30 parts by weight of CaO and about 25 parts by weight of talc were used.

Comparative Example 1

The hygroscopic adhesive layer was excluded in Example 1, and an adhesive layer consisting only of a filling adhesive layer was manufactured with the same thickness as Example 1, thus manufacturing an organic light emitting diode (OLED) display.

Experimental Example 1: Life-Span Test

The organic light emitting diode (OLED) displays manufactured in Examples 1 to 3 and Comparative Example 1 were introduced in a chamber (TH-TG_JEIO TECH. CO., Ltd.) of about 85° C. 85% RH (relative humidity), light emitting parts were observed according to time, and a time until a blind spot was generated was measured and described in the following Table 1.

Experimental Example 2: Water Vapor Transmission Rate

For the film type adhesive layers manufactured in Examples 1 to 3 and Comparative Example 1, water vapor transmission rate (WVTR) was measured (measuring instrument: Mocon Inc. permatran3/33ma).

Experimental Example 3: Adhesion Strength

For the adhesive layers manufactured in Examples 1 to 3 and Comparative Example 1, two specimens were stacked in a cross shape and bonded, and then, strength for detaching both specimens was measured using UTM (INSTRON, model-5900) thereby measuring adhesion strength.

TABLE 1

|  | Example 1 | Example 2 | Example 3 | Comparative Example 1 |
|---|---|---|---|---|
| WVTR g/m$^2$ | 8 | 7 | 5 | 10 |
| Adhesion strength (kgf/cm$^2$) | 23 | 23 | 23 | 23 |
| Blind spot generation time (hours) | 1,756 | 1,986 | 2,135 | 856 |

While this disclosure has been described in connection with what is presently considered to be practical example embodiments, it is to be understood that the embodiments are not limited to the disclosed embodiments, but, on the contrary, is intended to cover various modifications and equivalent arrangements included within the spirit and scope of the appended claims.

What is claimed is:

1. A method for manufacturing an organic light emitting diode (OLED) display, the method comprising:
    forming an organic light emitting element on a substrate;
    sequentially accumulating a first adhesive layer and a second adhesive layer so as to form an adhesive layer; and
    intervening the adhesive layer between the substrate on which the organic light emitting element is formed and an encapsulation substrate so as to bond them,
    wherein the first adhesive layer comprises an adhesive material, and the second adhesive layer comprises a hygroscopic material, and
    wherein bonding the encapsulation substrate with the substrate on which the organic light emitting element is formed is carried out by a lamination process, a press process, or a diaphragm process.

2. The method of claim 1, wherein the adhesive layer is formed by a roll-to-roll process, a roll-to-glass process, a press process, or a diaphragm process.

3. The method of claim 1, wherein the hygroscopic material includes at least one hygroscopic material selected from the group consisting of silica gel ($SiO_2H_2O$), alumino-silicate beads, montmorillonite, a molecular sieve of zeolite ($Na_{12}AlO_3SiO_2\ 12H_2O$), activated carbon, alkali metal oxide, alkaline earth metal oxide, metal sulfate, metal halide and metal perchlorate.

4. The method of claim 1, wherein the first adhesive layer further comprises at least one filling material selected from the group consisting of talc, silica, magnesium oxide, mica, montmorillonite, alumina, graphite, beryllia (beryllium oxide), aluminum nitride, silicon carbide, mullite and silicon.

5. The method of claim 1, wherein the hygroscopic material has a particle diameter of about 10 nm to about 20 µm.

6. The method of claim 1, wherein the adhesive layer includes thermally curable resin or photocurable resin.

7. A method for manufacturing an organic light emitting diode (OLED) display, the method comprising:
   forming an organic light emitting element on a first substrate;
   disposing a second substrate on the organic light emitting element; and
   intervening an adhesive layer between the first substrate on which the organic light emitting element is formed and the second substrate so as to bond them,
   wherein the adhesive layer comprises a thermally curable resin or a photocurable resin, and more than about 5 to about 50 parts by weight of a hygroscopic material based on 100 parts by weight of the thermally curable resin or the photocurable resin.

8. The method of claim 7, wherein the hygroscopic material includes at least one selected from the group consisting of silica gel ($SiO_2H_2O$), alumino-silicate beads, montmorillonite, a molecular sieve of zeolite ($Na_{12}AlO_3SiO_2 12H_2O$), activated carbon, alkali metal oxide, alkaline earth metal oxide, metal sulfate, metal halide and metal perchlorate.

9. The method of claim 7, wherein the hygroscopic material has a particle diameter of about 10 nm to about 20 µm.

10. The method of claim 7, wherein the hygroscopic material is mesoporous, plate-shaped, spherical, rod-shaped, fiber-shaped, or core-shell typed.

11. The method of claim 7, wherein the adhesive layer has a thickness of about 5 µm to about 50 µm.

* * * * *